(12) United States Patent  
Gilliland

(10) Patent No.: US 7,492,610 B2  
(45) Date of Patent: Feb. 17, 2009

(54) APPARATUS FOR IMPROVING SERVER ELECTROMAGNETIC SHIELDING

(75) Inventor: Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 11/426,051

(22) Filed: Jun. 23, 2006

(65) Prior Publication Data

US 2007/0297159 A1     Dec. 27, 2007

(51) Int. Cl.  
*H05K 9/00* (2006.01)

(52) U.S. Cl. .............. 361/818; 361/800; 361/816; 361/693; 361/692; 454/184; 174/350; 174/377; 174/383; 29/830

(58) Field of Classification Search ......... 361/692–694, 361/800, 816, 818; 29/830; 454/184; 174/350, 174/360, 357, 377, 382, 385  
See application file for complete search history.

(56) References Cited

U.S. PATENT DOCUMENTS

| | | | | |
|---|---|---|---|---|
| 5,928,076 A | * | 7/1999 | Clements et al. | 454/184 |
| 6,018,125 A | * | 1/2000 | Collins et al. | 174/383 |
| 6,211,458 B1 | * | 4/2001 | Mitchell et al. | 174/383 |
| 6,252,161 B1 | * | 6/2001 | Hailey et al. | 174/383 |
| 6,297,446 B1 | * | 10/2001 | Cherniski et al. | 174/383 |
| 6,426,459 B1 | * | 7/2002 | Mitchell | 174/382 |
| 6,610,922 B1 | * | 8/2003 | Twiss et al. | 174/390 |
| 6,635,820 B1 | * | 10/2003 | Mair | 174/377 |
| 6,870,092 B2 | * | 3/2005 | Lambert et al. | 174/355 |
| 6,947,294 B2 | * | 9/2005 | Lin et al. | 361/818 |
| 7,230,827 B2 | * | 6/2007 | Sun et al. | 361/695 |

* cited by examiner

*Primary Examiner*—Dean A. Reichard  
*Assistant Examiner*—Dameon E Levi  
(74) *Attorney, Agent, or Firm*—Cantor Colburn LLP

(57) ABSTRACT

Disclosed is an apparatus for improving server electromagnetic shielding at high and low frequencies, including a metallic plate in fixed association with a surface of a server casing, the metallic plate defining a plurality of openings, and a substantially plastic shield including conductive metal fibers and defining a plurality of bosses extending from a boss surface of the plastic shield, the bosses configured to be insertable within the plurality of openings to allow the boss surface to be disposed adjacent to the metallic plate, each of the plurality of bosses defining a boss cavity that extends entirely through the plurality of bosses and the plastic shield.

1 Claim, 4 Drawing Sheets

APPARATUS FOR IMPROVING SERVER ELECTROMAGNETIC SHIELDING

BACKGROUND OF THE INVENTION

1. Field of the Invention

The disclosure relates generally to an apparatus for improving server electromagnetic shielding, and more particularly to an apparatus for improving server electromagnetic shielding at high and low frequencies.

2. Description of the Background

Typically, a casing of a server will include a relative back surface (or portion thereof) that includes or defines a plurality of openings for allowing air to flow out of the server. Along with effecting airflow from the server, the characteristics of this surface affect electromagnetic compatibility (EMC) of the server with other electronic equipment in the server's environment. EMC is the measure of unintentional generation, propagation and reception of electromagnetic energy, and the unwanted effects that such an energy may induce in an electronic component environment. Depending upon surface composition, the relative back surface will have different levels of effectiveness in shielding the server from various electromagnetic frequencies. For example, if the surface comprises conductive fiber filled plastic that is molded into a plurality of bosses (i.e. opening structures extend into the server), it will effectively shield the server from high frequency electromagnetic energy. This is because the penetration of the bosses into the server results in an increase of the effective thickness of the opening pattern. With the bosses acting as waveguides that penetrate into the server beyond its junction with the back surface, shielding effectiveness of the structure, at any frequency, is improved.

However, the essentially internal conductive fibers will be less apt to conduct lower frequency energy, rendering the plastic surface less effective at lower frequencies. This is because the conductive fiber filled plastic is manufactured to include a thin skin of non-conductive resin. This resin makes it difficult for low frequency current to contact the internal fibers. Low frequency energy that cannot contact the conductive fibers, and thus be allowed to smoothly transition through the plastic back surface, creates a radiating voltage across the junction between the server and the plastic back surface. This radiating voltage could be avoided by may be machining, drilling or milling the conductive fiber filled plastic to allow better low frequency access to the fibers, but this additional manufacturing process is costly.

Referring to a back surface that is entirely or almost entirely metal, a necessary conductivity will be exhibited to conduct and shield against lower frequency electromagnetic energy. This is because the substantially metal composition allows low frequency energy to smoothly transition through the back surface. However, configuring opening structures in a metal surface to include the bosses discussed above is difficult and costly, particularly as compared with the plastic molding. Without the depth of penetration that is achieved by the bosses, the metal surface will not include waveguides that extend beyond the junction between the server and the back surface, rendering it less effective at shielding the server from higher frequency energy. Therefore, a surface including a composition and shape that will economically shield against both high and low frequency electromagnetic energy is desirable.

SUMMARY OF THE INVENTION

The shortcomings of the prior art are overcome and additional advantages are provided through the provision of an apparatus for improving server electromagnetic shielding at high and low frequencies, including a metallic plate in fixed association with a surface of a server casing, the metallic plate defining a plurality of openings, and a substantially plastic shield including conductive metal fibers and defining a plurality of bosses extending from a boss surface of the plastic shield, the bosses configured to be insertable within the plurality of openings to allow the boss surface to be disposed adjacent to the metallic plate, each of the plurality of bosses defining a boss cavity that extends entirely through the plurality of bosses and the plastic shield.

BRIEF DESCRIPTION OF THE DRAWINGS

The foregoing and other features and advantages of the present invention should be more fully understood from the following detailed description of illustrative embodiments taken in conjunction with the accompanying Figures in which like elements are numbered alike in the several Figures.

DETAILED DESCRIPTION OF THE INVENTION

Figure 1:
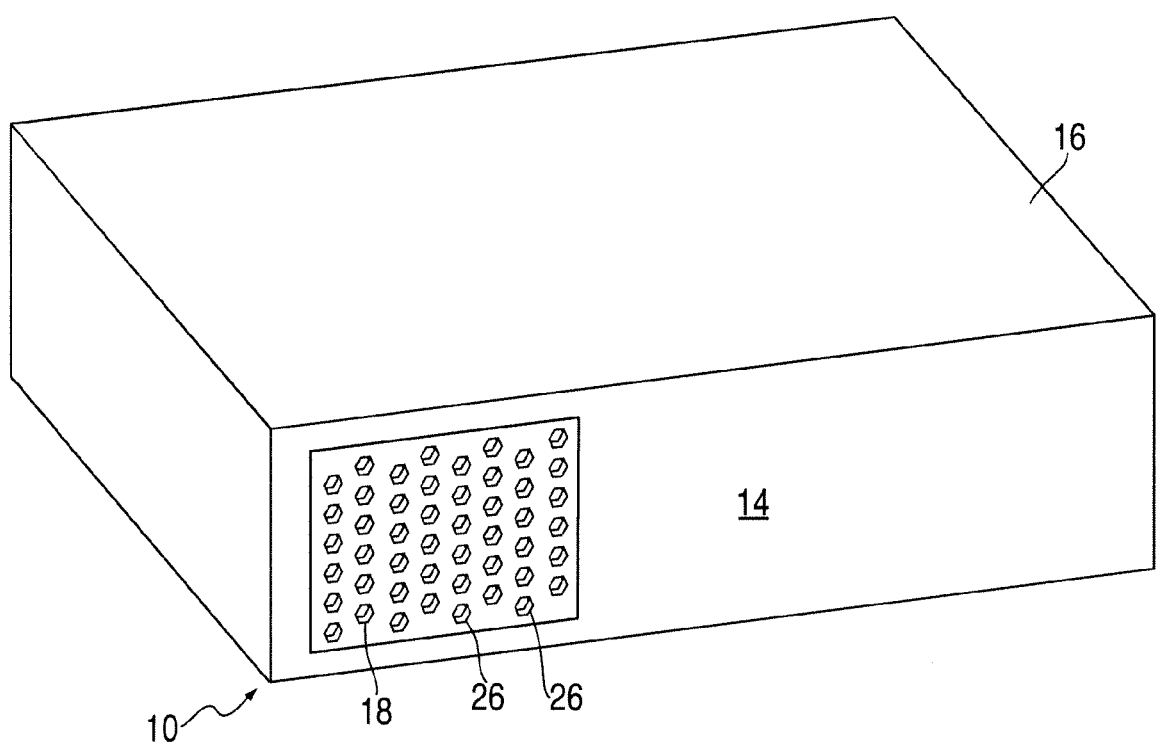
FIG. 1 is a top perspective view of a substantially plastic shield.
Figure 2:
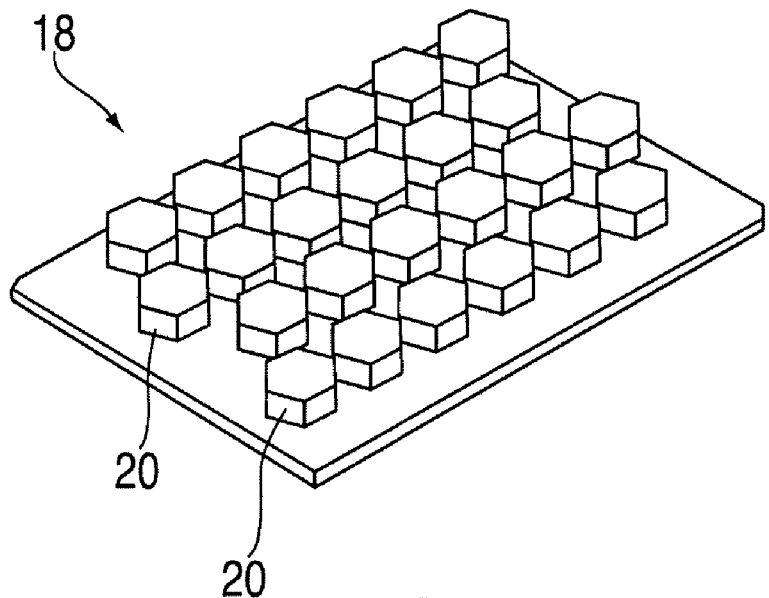
FIG. 2 is a side perspective view of the substantially plastic shield and a metallic plate.
Figure 3:
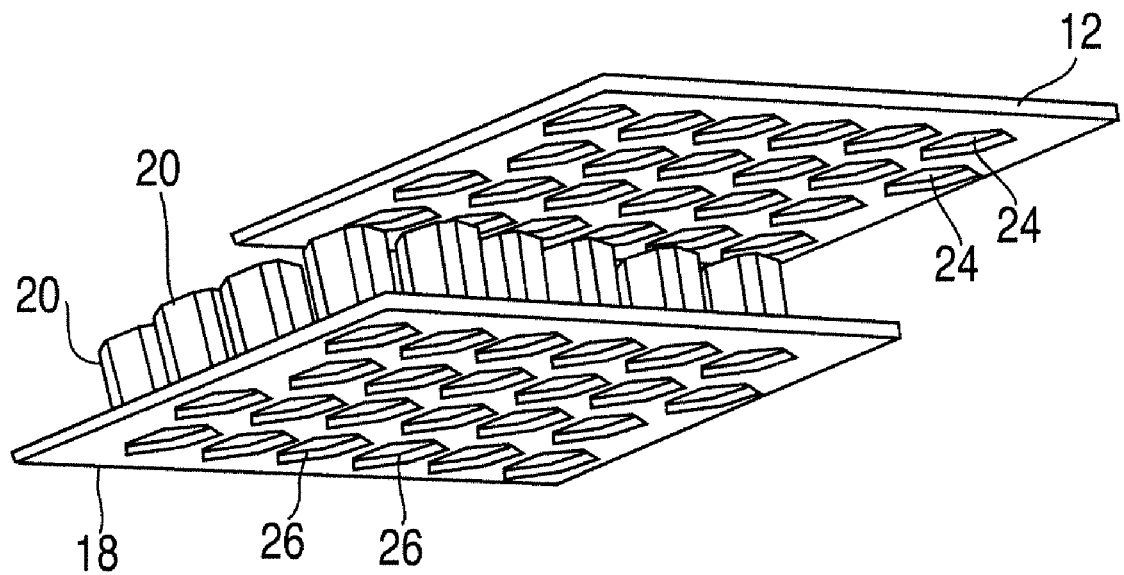
FIG. 3 is a side perspective view of an apparatus for improving server electromagnetic shielding at high and low frequencies.

Referring to FIGS. 1-3, an apparatus 10 for improving server electromagnetic shielding at high and low frequencies is illustrated. The apparatus 10 includes a metallic plate 12 fixedly associated with a surface 14 of a server casing 16. The apparatus 10 also includes a substantially plastic shield 18. The plastic shield 18 defines a plurality of bosses 20 extending from a boss surface 22 of the plastic shield 18, wherein the bosses 20 are configured to be insertable within a plurality of openings 24 defined by the metallic plate 12. Insertion of the bosses 20 into the openings 24 allows the boss surface 22 to be disposed adjacent to the metallic plate 12. Each of the bosses 20 defines a boss cavity 26 that extends entirely through each boss 20 and plastic shield 18. These boss cavities 26 allow air to flow out of the server casing 16 (typically via internal fans that are not illustrated) and into an ambient environment. Each boss 20 may be of any length desirable, with an exemplary embodiment including bosses 20 that are 13 mm in length.

The plastic shield 18 (including the bosses 20) includes metallic conductive fibers, such as stainless steel or copper, woven into its construction. Metal fiber filled plastic, like that which is used to construct the plastic shield 18, is effective at providing EMC shielding (for example to a server) against higher frequency electromagnetic energy (such as that which exceeds 1.5 GHz). This is because the presence of the metal fibers offers enough conductive material to conduct higher frequency energy, and the depth to which the bosses 20 penetrate into the server casing 16 results in an increase of the effective thickness of the shield 18, with the bosses acting as waveguides that penetrate into the server casing 16 beyond its surface 14. However, because the plastic shield 18 does not entirely comprise conductive metal, it is less effective at conducting lower frequency energy, rendering it less effective at providing EMC shielding against this energy (under 1.5 GHz). On the other hand, perforated metallic plates such as the metallic plate 12 are effective at providing EMC shielding against lower frequency electromagnetic energy because they entirely comprise conductive metal. These plates are less effective at higher frequencies however, because they lack depth of penetration like that which is achieved by the bosses. By associating the plastic shield 18 with the metallic plate 12 via insertion of the bosses 20 into the openings 24, the apparatus 10 includes both metal fiber filled plastic and perforated metallic plates, allowing for effective shielding at both high and low frequencies.

In addition, the depth to which the bosses 20 penetrate allows for decreased airflow resistance from the server casing 16 to the ambient environment, improving server cooling. The improved airflow is achievable despite a decrease in airflow caused by increasing the depth of the bosses 20. This decrease in airflow can be overcome and improved upon because the improved shielding effectiveness achieved by the apparatus 10 allows the bosses 20 to include boss cavities 26 of a larger diameter. These larger diameter boss cavities 26 are thusly responsible for the improved airflow.

Still further, presence of the substantially plastic shield 18 on an outer surface (such as the surface 14) of the server casing 16 creates a power dissipative resistance path that will allow a server to maintain functionality through an electrostatic discharge (ESD) event.

It should be appreciated that the bosses 20 and openings 42 may be of any functional shape, including hexagonal, cylindrical, and conical. The shapes of the bosses 20 should be compatible with the shapes of the openings 24 (i.e. an apparatus 10 with hexagonally shaped bosses may also include hexagonally shaped openings 24), allowing the bosses 20 to be insertable within the openings 24.

Figure 4:
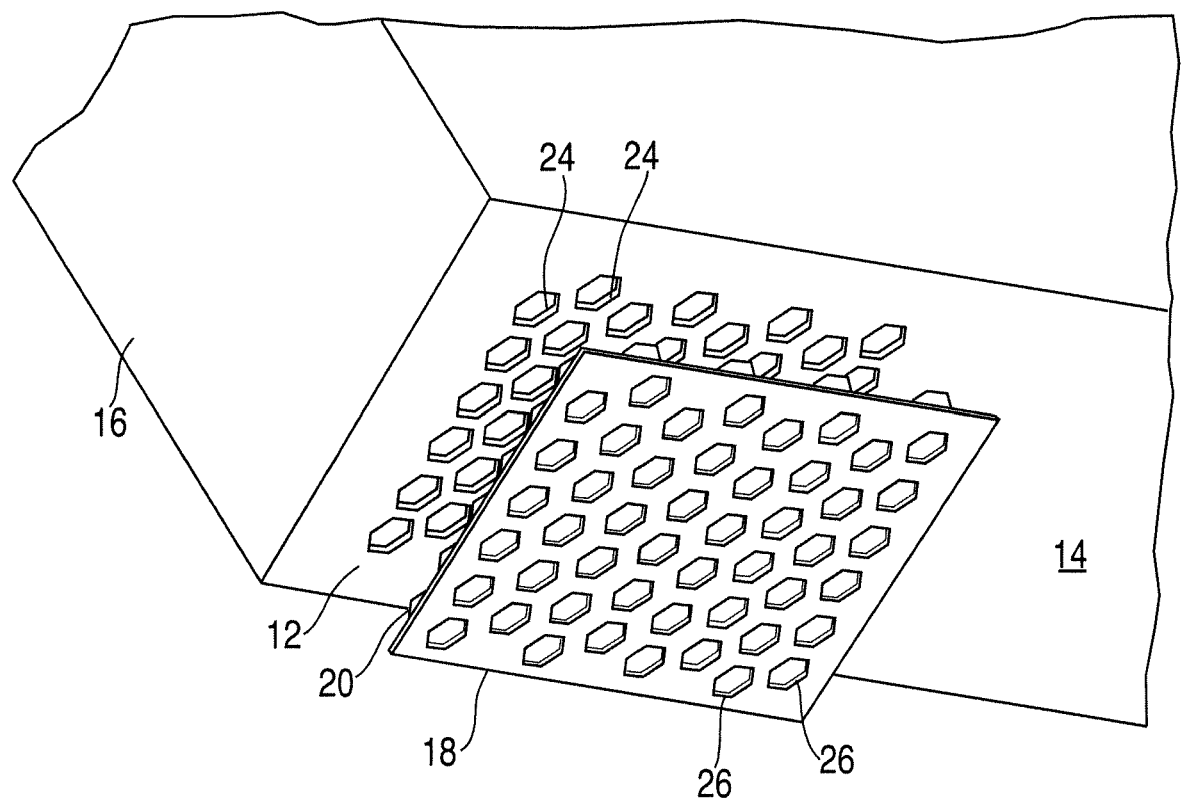
FIG. 4 is a side perspective view of an apparatus for improving server electromagnetic shielding at high and low frequencies, wherein the metallic plate is of unitary construction with a surface of a server casing.
Figure 5:
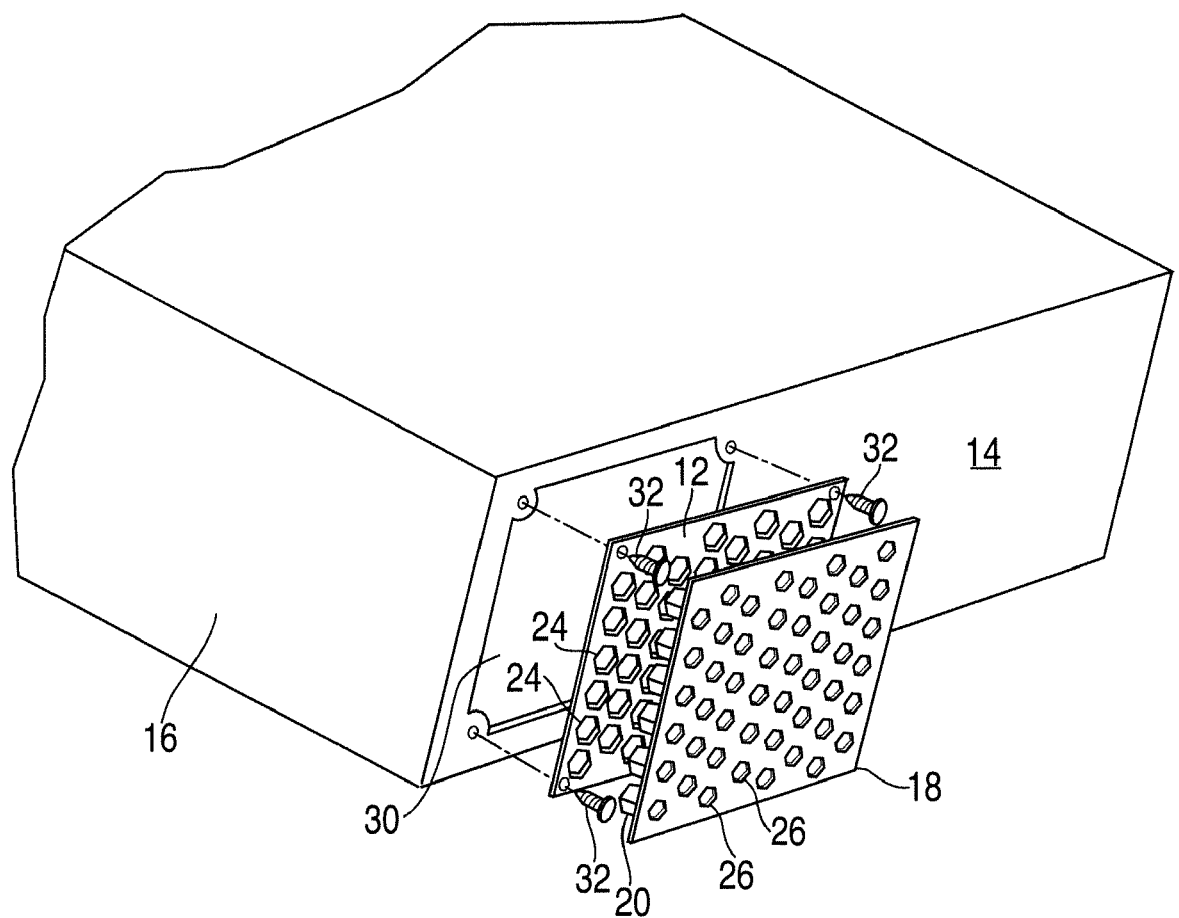
FIG. 5 is a side perspective view of an apparatus for improving server electromagnetic shielding at high and low frequencies, wherein the metallic plate is of separate construction with the surface of the server casing.

It should be additionally appreciated, referring to FIG. 4, that the metallic plate 12 may be of unitary construction with the surface 14 of the server casing 16, with the plastic shield 18 being a separate component associable therewith. Referring to FIG. 5, the metallic plate 12 may additionally be of separate construction from the server casing 16, wherein the metallic plate is installed into a cavity 30 defined by the surface 14 of the server casing 16. This installation may take place via any means necessary, including threaded instruments 32 running through the metallic plate 12 (as shown in FIG. 5), or both the metallic plate 12 and plastic shield 18 (wherein the plate 12 and shield 18 are installed as a unit). The apparatus 10 may be installed anywhere and in any amount on and about the server casing 16.

While the invention has been described with reference to an exemplary embodiment, it should be understood by those skilled in the art that various changes may be made and equivalents may be substituted for elements thereof without departing from the scope of the invention. In addition, many modifications may be made to adapt a particular situation or substance to the teachings of the invention without departing from the scope thereof. Therefore, it is important that the invention not be limited to the particular embodiment disclosed as the best mode contemplated for carrying out this invention, but that the invention will include all embodiments falling within the scope of the apportioned claims. Moreover, unless specifically stated any use of the terms first, second, etc. do not denote any order or importance, but rather the terms first, second, etc. are used to distinguish one element from another.

What is claimed is:

1. A method for improving server electromagnetic shielding at high and low frequencies, the method comprising:
   fixedly associating a metallic plate with a surface of a server casing, said metallic plate defining a plurality of openings;
   inserting a plurality of bosses defined by and extending from a boss surface of a substantially plastic shield into said openings defined by said metallic plate, said substantially plastic shield including conductive metal fibers, and each of said plurality of bosses defining a boss cavity that extends entirely through said plurality of bosses and said plastic shield; and
   disposing said boss surface adjacent to said metallic plate via said inserting.

\* \* \* \* \*